US012757741B2

(12) United States Patent
Lee et al.

(10) Patent No.: US 12,757,741 B2
(45) Date of Patent: Oct. 6, 2026

(54) METHOD OF MANUFACTURING SEMICONDUCTOR DEVICE

(71) Applicant: Samsung Electronics Co., Ltd., Suwon-si (KR)

(72) Inventors: Jaeil Lee, Hwaseong-si (KR); Kyoungcho Na, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 978 days.

(21) Appl. No.: 18/051,639

(22) Filed: Nov. 1, 2022

(65) Prior Publication Data

US 2023/0275032 A1 Aug. 31, 2023

(30) Foreign Application Priority Data

Feb. 25, 2022 (KR) ........................ 10-2022-0025512

(51) Int. Cl.
*H10W 46/00* (2026.01)
*H10P 50/00* (2026.01)

(52) U.S. Cl.
CPC ........... *H10W 46/00* (2026.01); *H10P 50/691* (2026.01); *H10W 46/301* (2026.01)

(58) Field of Classification Search
None
See application file for complete search history.

(56) References Cited

U.S. PATENT DOCUMENTS 7,068,833 B1 6/2006 Ghinovker et al.
7,177,457 B2 2/2007 Adel et al.
7,274,814 B2 9/2007 Ghinovker et al.
7,317,824 B2 1/2008 Ghinovker et al.
7,879,627 B2 2/2011 Ghinovker et al.
8,194,230 B2 6/2012 Chan et al.
8,317,344 B2 11/2012 Williamson et al.
8,804,137 B2 8/2014 Choi et al.
9,400,435 B2 7/2016 Liou et al.
10,627,729 B2 4/2020 Schmitt-Weaver et al.
10,788,806 B2 9/2020 Good et al.
10,809,624 B2 10/2020 Lee et al.
10,824,071 B2 * 11/2020 Lee ........................... G03F 1/72
10,908,506 B2 2/2021 Kim
11,126,096 B2 9/2021 Da Silveira et al.
11,137,690 B2 10/2021 Hsu
11,221,561 B2 1/2022 Demirer et al.
12,216,412 B2 2/2025 Hsieh et al.
2018/0292761 A1 10/2018 Cekli et al.
2021/0011373 A1 1/2021 Lee et al.

FOREIGN PATENT DOCUMENTS

CN 101261451 B 6/2011
CN 105225978 B 6/2019
JP 3198310 B2 8/2001
JP 2011-221451 A 11/2011
JP 5151908 B2 2/2013
JP 2020-123700 A 8/2020
JP 6755733 B2 9/2020
KR 10-0734079 B1 7/2007
KR 10-2014-0126341 A 10/2014
KR 10-2016-0026616 A 3/2016
KR 10-2016-0026683 A 3/2016
KR 10-2020-0040104 A 4/2020
TW 2021-41207 A 11/2021
TW 2022-01139 A 1/2022

OTHER PUBLICATIONS

Office Action in Taiwanese Appln. No. 111147018, mailed on May 21, 2025, 13 pages (with Machine translation).
Office Action in Korean Appln. No. 10-2022-0025512, mailed on Dec. 16, 2025, 15 pages (with English translation).
Notice of Allowance in Korean Appln. No. 10-2022-0025512, mailed on May 13, 2026, 5 pages (with English translation).

* cited by examiner

*Primary Examiner* — Anca Eoff
(74) *Attorney, Agent, or Firm* — Fish & Richardson P.C.

(57) ABSTRACT

A method of manufacturing a semiconductor device includes forming a first layer on a wafer through a single shot exposure, a single shot of the first layer including first overlay marks; forming a second layer and a first photoresist film on the first layer; and performing an upper shot exposure and a lower shot exposure onto the first photoresist film based on a first overlay function of the single shot of the first layer generated based on absolute measurement of the first overlay marks. An upper shot transferred by the upper shot exposure and a lower shot transferred by the lower shot exposure are identical to each other, and an area of each of the upper shot and the lower shot is less than an area of the single shot of the first layer.

8 Claims, 13 Drawing Sheets

METHOD OF MANUFACTURING SEMICONDUCTOR DEVICE

CROSS-REFERENCE TO RELATED APPLICATION

This application is based on and claims priority under 35 U.S.C. § 119 to Korean Patent Application No. 10-2022-0025512, filed on Feb. 25, 2022, in the Korean Intellectual Property Office, the disclosure of which is incorporated by reference herein in its entirety.

BACKGROUND

The inventive concepts relate to methods of manufacturing a semiconductor device, and more particularly, to methods of manufacturing a semiconductor device with enhanced reliability and yield.

According to the recent trend to reduce the size of memory cells for higher degree of integration of information and communication devices, operation circuits and/or wiring structures included in the memory devices for operations and electrical connection of the semiconductor devices have become complex. Accordingly, there is growing application of an extreme ultraviolet (EUV) lithography process to the manufacturing of semiconductor devices. The EUV lithography process is lithography technology using light having a wavelength ranging from about 4 nm to about 124 nm, for example, a wavelength of 13.5 nm, and facilitates processing of ultra micro-scale dimension less than or equal to 20 nm (sub-20 nm) which is difficult to achieve through lithography technology using the existing ArF excimer laser beam.

The feedback process through highly reliable and precise overlay measurements and analyses is one of the key components to secure the reliability of the EUV lithography process. Accordingly, various researches have been conducted to enhance the accuracy and reliability of overlay measurement.

SUMMARY

Some example embodiments of the inventive concepts provide methods of manufacturing a semiconductor device with enhanced reliability and yield.

According to an aspect of the inventive concepts, a method of manufacturing a semiconductor device includes forming a first layer on a wafer through a single shot exposure, a single shot of the first layer including first overlay marks, forming a second layer and a first photoresist film on the first layer, and performing an upper shot exposure and a lower shot exposure onto the first photoresist film based on a first overlay function of a single shot of the first layer generated based on absolute measurement of the first overlay marks, wherein an upper shot transferred by the upper shot exposure and a lower shot transferred by the lower shot exposure are identical to each other, and an area of each of the upper shot and the lower shot is less than an area of the single shot of the first layer.

According to another aspect of the inventive concepts, a method of manufacturing a semiconductor device includes exposing, through scanning, a first photoresist film of each of wafers of a first lot to an upper shot and a lower shot, the upper shot and the lower shot being identical to each other, a length of each of the upper shot and the lower shot in a first direction being greater than a length of each of the upper shot and the lower shot in a second direction, is the second direction being a scanning direction, the first direction and the second direction being perpendicular to each other, measuring an overlay value of the upper shot and the lower shot of each of the wafers of the first lot, and through a regression analysis of the measured overlay value, generating an overlay function representing an overlay of the upper shot and the lower shot, and exposing, through scanning, a second photoresist film of each of wafers of a second lot to the upper shot and the lower shot based the overlay function.

According to still another aspect of the inventive concept, a method of manufacturing a semiconductor device includes forming a first layer on a wafer, the first layer including first overlay marks, forming a second layer and a first photoresist film on the first layer, exposing the first photoresist film to an upper shot and a lower shot, the upper shot and the lower shot being identical to each other, forming a first photoresist pattern by developing the first photoresist film, calculating an overlay function representing an overlay of the upper shot and the lower shot by measuring an overlay between the first photoresist pattern and the first overlay marks, removing the first photoresist pattern in response to the overlay function being out of a range; forming a second photoresist film on the second layer, and exposing the second photoresist film to the upper shot and the lower shot based on the overlay function, wherein the first photoresist film and the second photoresist film are exposed by anamorphic reduction projection.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1:
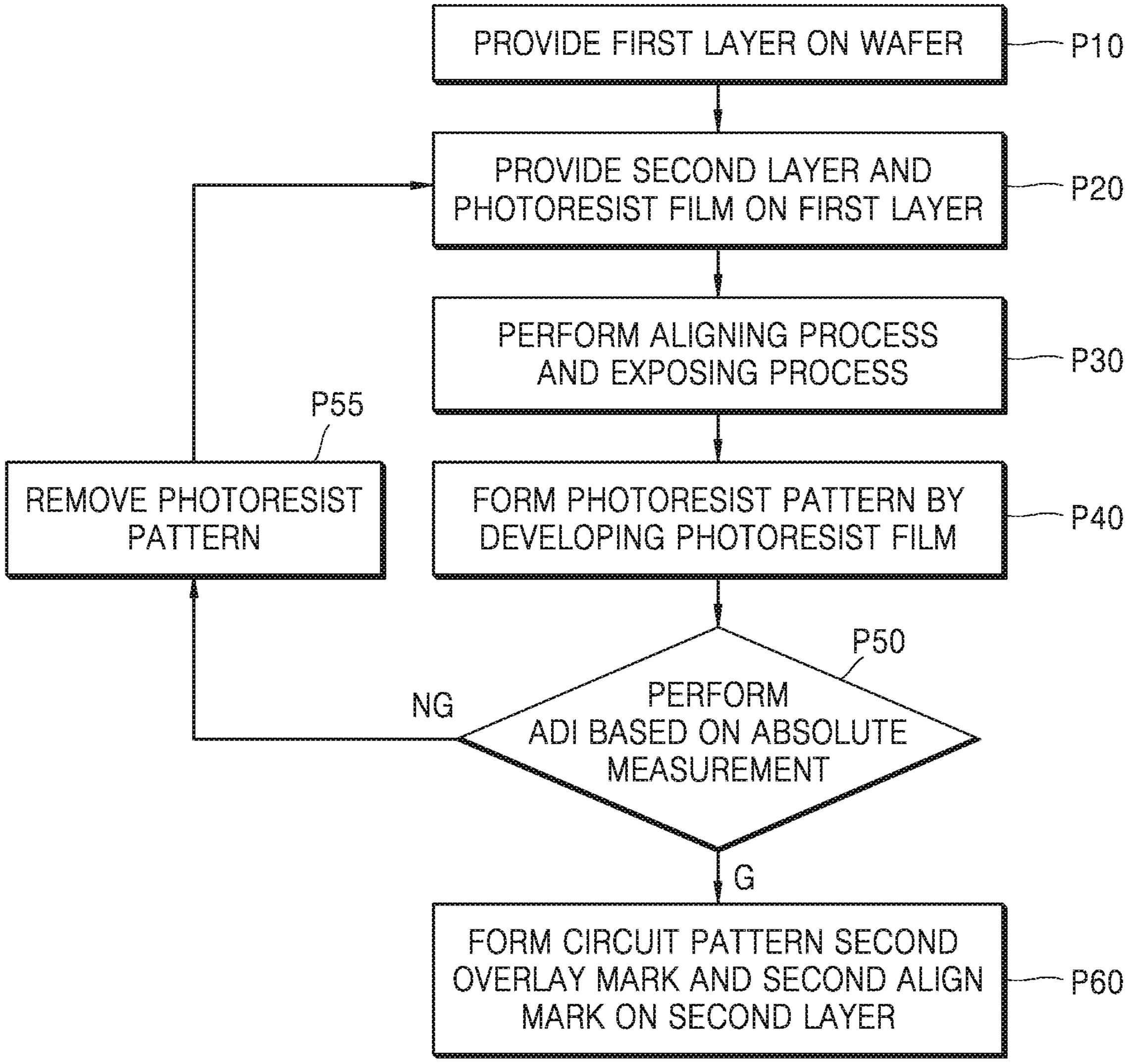
FIG. 1 is a flowchart for explaining a method of manufacturing a semiconductor device, according to an example embodiment.

Hereinafter, some example embodiments of the inventive concepts will be described in detail with reference to the accompanying drawings. In the drawings, like reference numerals denote like components, and any redundant description thereon will be omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, the term "and/or" includes any and all combinations of one or more of the associated listed items. Expressions such as "at least one of" and "any one of" when preceding a list of elements, modify the entire list of elements and do not modify the individual elements of the list. Thus, for example, both "at least one of A, B, and C" and "A, B, and/or C" means either A, B, C or any combination thereof.

FIG. 1 is a flowchart of explaining a method of manufacturing a semiconductor device, according to an example embodiment.

FIGS. 2A to 6B are diagrams for explaining a method of manufacturing a semiconductor device, according to an example embodiment.

Figure 2A:
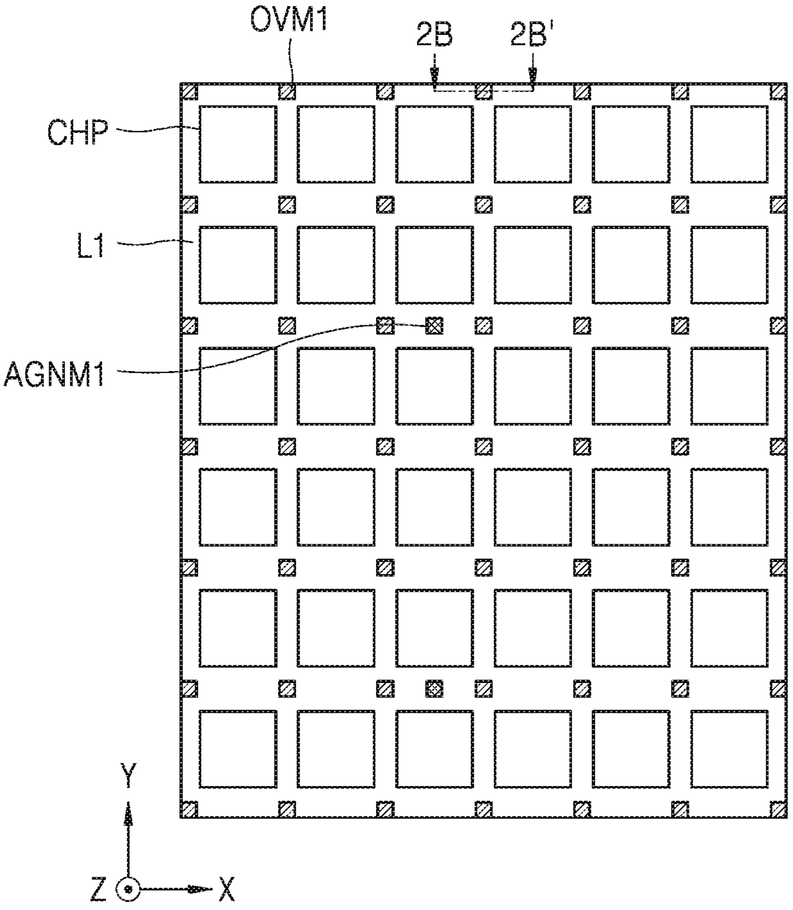
FIGS. 2A to 6B are diagrams for explaining a method of manufacturing a semiconductor device, according to an example embodiment.
Figure 2B:
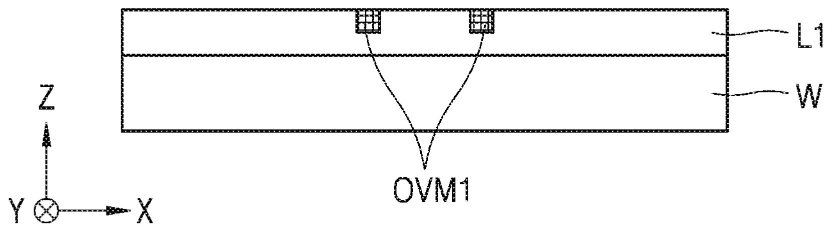
Figure 3:
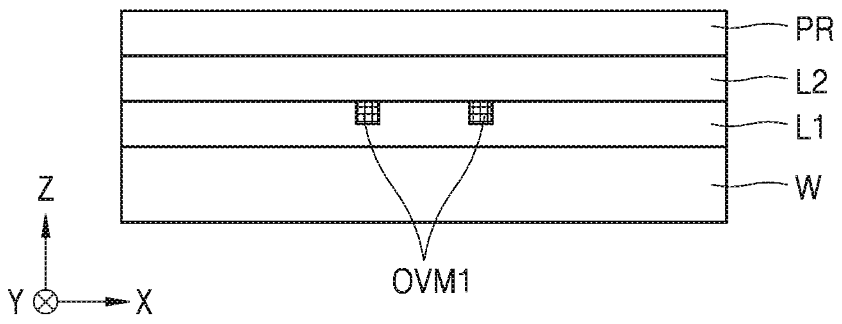
Figure 4A:
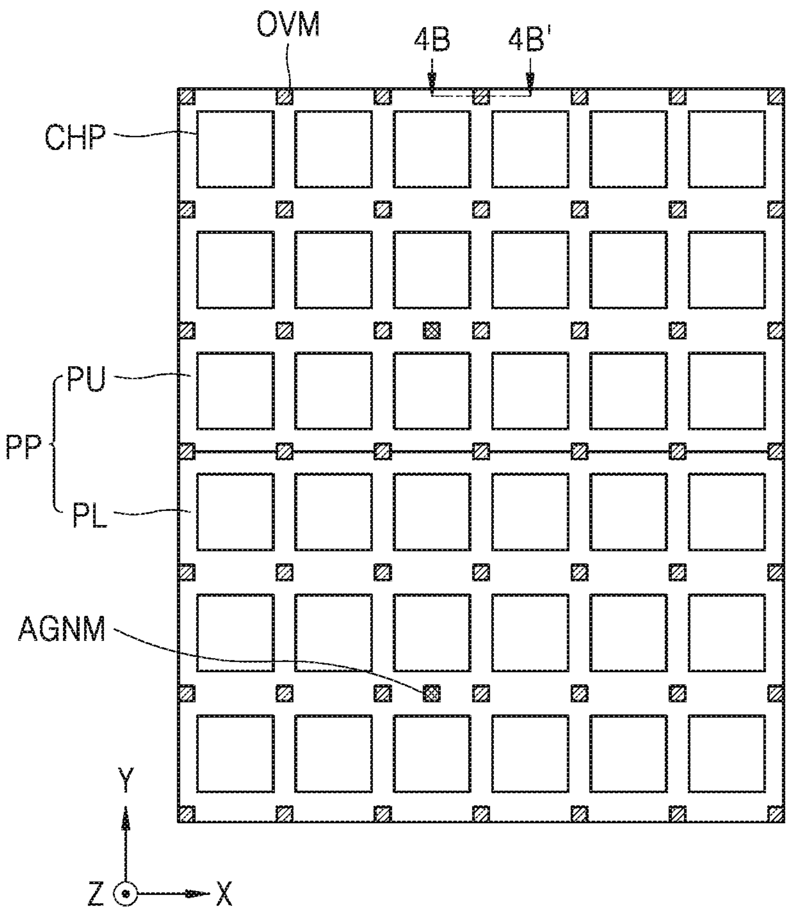
Figure 4B:
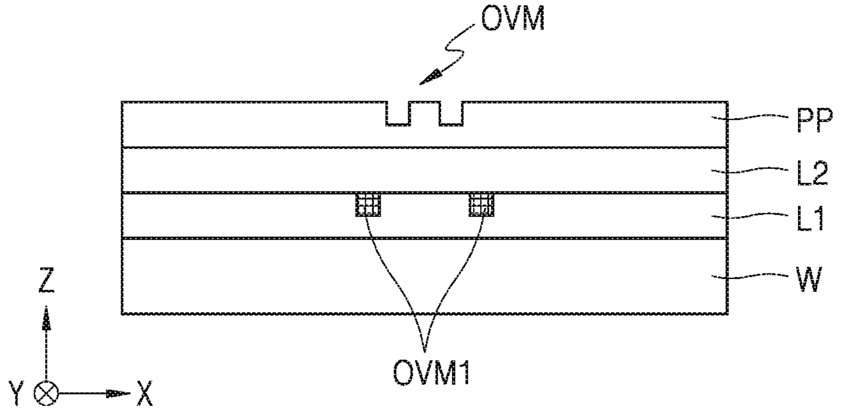
Figure 5:
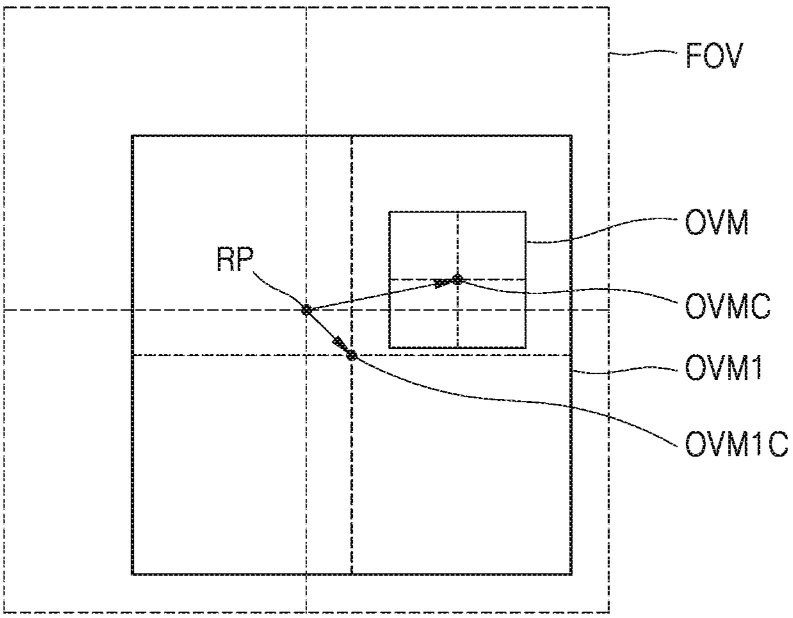
Figure 6A:
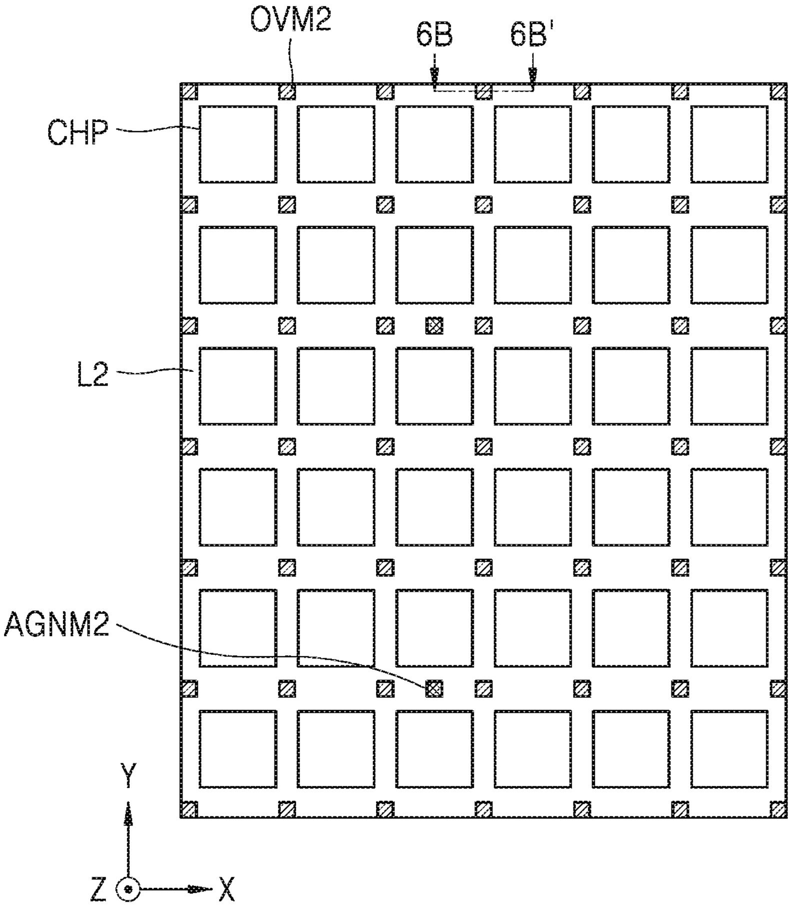
Figure 6B:
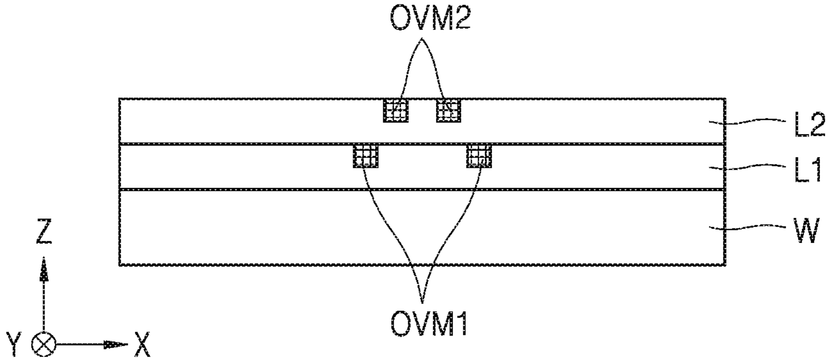

More specifically, FIG. 2A is a plan view illustrating a first layer L1 formed on a wafer W, and FIG. 2B is a cross-sectional view taken along line 2B-2B' of FIG. 2A. FIG. 3 illustrates a part corresponding to FIG. 2B. FIG. 4A is a plan view illustrating a photoresist pattern PP formed on the wafer W, and FIG. 4B is a cross-sectional view taken along line 4B-4B' of FIG. 4A. FIG. 5 is a diagram schematically illustrating aspects of absolute overlay measurement. FIG. 6A is a plan view illustrating a second layer L2 on which second overlay marks OVM2 are formed on the wafer W, and FIG. 6B is a cross-sectional view taken along line 6B-6B' of FIG. 6A.

With reference to FIGS. 1 to 2B, in operation P10, the first layer L1 may be formed on the wafer W.

The forming of the first layer L1 may include providing a photoresist, performing a lithography process including an exposure process and a developing process on the photoresist, patterning the first layer L1 by using a photoresist pattern, and forming a first overlay mark OVM1 and a circuit pattern.

The providing of the photoresist may include performing an adhesion promoting process and a spin coating process on the wafer. The adhesion promoting process refers to a process of attaching the photoresist to the wafer W or an insulating layer and circuit patterns formed on the wafer W. A photoresist material may have low adhesive strength with respect to a surface of silicon or a material including silicon. Accordingly, before providing a photoresist material on the wafer W, the adhesion promoting process may be performed on a surface of the wafer W (or a surface of a material layer formed on the wafer W). For example, processing the surface of the wafer W with hexamethyldisilazane (HMDS) is one of the example adhesion promoting processes. As HMDS may make the surface of the wafer W hydrophobic, the adhesive strength between the photoresist material and the wafer W may improve.

The spin coating process refers to a process of providing photoresist on the wafer W. The photoresist may include organic polymer. To coat the wafer W with the photoresist, the wafer W on which the photoresist in a state of a solution is provided may be spin-rotated at a high speed. Due to the spin-rotation of the wafer W, a photoresist film having a uniform thickness may be formed.

After the spin coating process, a soft bake process may be performed selectively. In some cases, the density of a photoresist material layer coated on the wafer W may not be high enough to proceed with subsequent processes. Through the soft bake process, the photoresist material layer may be densified, and a remaining solvent on the photoresist material layer may be removed. The soft bake process may be performed by a bake plate of an exposure device. The wafer W on which the soft bake process is performed may be selectively arranged on a chill plate and cooled.

Then, the exposing process to transfer the circuit pattern, the first overlay marks OVM1, and first align marks AGNM1 pre-formed at a lithography mask to the wafer W may be performed. The exposing process may use one of a deep ultraviolet (DUV) radiation beam and/or a low numerical aperture extreme ultraviolet (EUV) radiation beam. When the exposing process is performed by using the low numerical aperture EUV radiation beam, unlike in the exposing process of operation P30 to be described, a reduction ratio of the exposing process in the X direction and a reduction ratio of the exposing process in the Y direction may each be 1/4. Here, a low numerical aperture may refer to a value of a numerical aperture less than about 0.35, and a high numerical aperture may refer to a value of a numerical aperture equal to or greater than about 0.35.

After the exposing process, an after-exposure bake process may be selectively performed before a developing process. The after-exposure bake process may be performed by a bake plate. The after-exposure bake process may refer to an optional process used to induce improvement of uniformity of the photoresist film through chemical reaction or diffusion of a particular component in the photoresist film.

Afterwards, the developing process to remove an exposed part or unexposed part of the photoresist may be performed. A photoresist pattern may be formed by the developing process.

By using the photoresist pattern, the first layer L1 may be patterned, and the circuit pattern (not shown), the first overlay marks OVM1, and the first align marks AGNM1 may be formed on the patterned first layer L1. The first layer L1 may be patterned by dry etching or wet etching. When the thickness of the first layer L1 (e.g., a length in the Z direction) is thicker than a certain value, a hard mask layer for etching the first layer L1 may be further provided between the photoresist and the first layer L1.

FIG. 2A is a plan view of the first layer L1 corresponding to a single full shot. The full shot may refer to a part on the wafer W to which an entire pattern formed on a patterning device, such a lithography mask, is transferred. A plurality of chip areas CHP may be defined in one full shot. The plurality of chip areas CHP each may be an area in which a semiconductor chip is formed by overlapping a plurality of circuit layouts for forming a semiconductor device. According to some example embodiments, the full shot may have a size of about 26 mm along the x axis and a size of about 33 mm along the y axis. However, the inventive concepts are not limited thereto. Various numbers and sizes of chip areas CHP may be included in one full shot according to a type and specification of a device to be formed. For example, the full shot may include only one chip area.

According to some example embodiments, a memory device may be formed in the chip areas CHP. According to some example embodiments, a non-volatile memory device may be formed in the chip areas CHP. According to some example embodiments, the non-volatile memory device may be non-volatile NAND-type flash memory. According to some example embodiments, the non-volatile memory device may be one of phase-change random access memory (PRAM), magnetic random access memory (MRAM), resistive random access memory (ReRAM), ferroelectric random access memory (FRAM), or NOR flash memory. Moreover, a volatile memory device, such as dynamic random access memory (DRAM) or static random access memory (SRAM), which loses data when the power is off, may be formed in the chip areas CHP.

According to some example embodiments, one of a logic chip, a measurement device, a communication device, a digital signal processor (DSP), and a system-on-chip (SoC) may be formed in the chip areas CHP.

Although the chip areas CHP are described as having a square or substantially square profile, the inventive concepts are not limited thereto. For example, the chips may be a driver integrated circuit (IC) chip, and in such case, a pair of edges of the IC chip may be longer than the other pair of edges.

A scribe lane SL may extend between the chip areas CHP and separate the chip areas CHP from each other horizontally (e.g., in any one of the X direction and the Y direction). The scribe lane SL may be an area to separate semiconductor chips formed on the chip areas CHP into individual devices in a singulation process.

The first align marks AGNM1 and the first overlay marks OVM1 may be arranged on the scribe lane SL. Although FIG. 2A illustrates that the first align marks AGNM1 and the first overlay marks OVM1 are formed only on the scribe lane SL, the inventive concepts are not limited thereto. For example, some of the first align marks AGNM1 and the first overlay marks OVM1 may be formed in the chip areas CHP.

According to some example embodiments, the first align marks AGNM1 may be a pattern to accurately set a part of the wafer W to be exposed during the exposing process. According to some example embodiments, the first overlay marks OVM1 may be a pattern for measurement of overlay. According to some example embodiments, the first overlay marks OVM1 may be arranged with a density higher than that of the first align marks AGNM1.

Other marks having various functions may be further provided on the scribe lane SL. For example, a mark for electrically testing characteristics of a final semiconductor device, a mark for measuring the thickness of an uppermost layer after a chemical mechanical polishing (CMP) process, a mark for measuring an optical threshold dimension or an inside thickness, etc. may be further provided at the first layer L1.

Here, the first overlay marks OVM1 and the first align marks AGNM1 may include any one of a box-in-box structure and a grating structure. The first overlay marks OVM1 and the first align marks AGNM1 having the box-in-box structure may need an exclusive area around which other patterns, such as the first overlay marks OVM1 and the first align marks AGNM1 are not formed. The overlay marks having the grating structure may not need an exclusive area and may be provided in a higher density than the overlay marks having the box-in-box structure.

Hereinafter, for convenience of explanation, some example embodiments are described focusing on an example in which the first overlay marks OVM1 and overlay molds OVM (see FIG. 4A) have the box-in-box structure. However, a person skilled in the art may easily derive an example in which each of the first overlay marks OVM1 and the overlay molds OVM (see FIG. 4A) has the grating structure based on the descriptions provided herein.

With reference to FIGS. 1 and 3, in operation P20, a photoresist film PR may be provided on the first layer.

As in operation P10, the providing of the photoresist film PR may include performing the adhesion promoting process and the spin coating process. The photoresist film PR may be photoresist for EUV. In the case of the EUV exposing process, as the number of photons is less than a DUV exposing process, etc., a material having a high EUV absorption rate may be desired. Accordingly, the photoresist film PR may include, for example, hydroxy styrene, which is polymer. In some example embodiments, iodophenol may be provided to the photoresist film PR as an additive.

According to some example embodiments, the thickness of the photoresist film PR may range from about 0.1 μm to about 2 μm. According to some example embodiments, the thickness of the photoresist film PR may range from about 200 nm to about 600 nm. In the case of photoresist film PR for EUV, the photoresist film PR for EUV may be provided in a thin thickness by spin-coating it with a low concentration photoresist solution.

In some cases, the photoresist film PR may include an inorganic material, such as tin oxide. In such a case, even after the photoresist film PR is removed through a strip process after the lithography process and other subsequent processes, an inorganic material may remain at an underlying layer of the photoresist film PR (e.g., the first layer L1) in a concentration less than or equal to about $1*10^{11}/cm^3$. When the photoresist film PR includes in inorganic material, it may be easy to make the thickness of the photoresist film PR thin, which leads to higher etching selectivity, to have an effect of providing a hard mask having a thin thickness under the photoresist film PR during the etching process.

When an etching target layer has a thickness greater than a certain threshold thickness, a hard mask layer including amorphous carbon may be further provided under the photoresist film PR. According to some example embodiments, the hard mask layer may further include fluorine. When the hard mask layer includes fluorine, the EUV sensitivity of the photoresist film PR may improve. Furthermore, an anti-reflection layer may be further provided between the hard mask layer and the photoresist film PR.

In operation P30, the aligning process and the exposing process may be performed.

The exposing process may refer to a process to partially change the characteristics of the photoresist film PR to form the photoresist pattern PP (see FIG. 4B) for forming a semiconductor circuit. Photoresist refers to a material which causes a photochemical reaction when exposed to light. The photoresist film PR may be partially exposed by a patterning device, such as a photo mask. By projecting light transmitted through the patterning device on the photoresist film PR, a single-layer circuit pattern constituting the semiconductor device may be transferred to the photoresist film PR on the wafer W.

The exposing process may be performed based on measurement of the first align marks AGNM1 formed on the first layer L1 (e.g., the aligning process). Prior to the exposure, by identifying positions of the first align marks AGNM1, a difference between designed positions of the first align marks AGNM1 and the identified positions of the first align marks AGNM1 formed on the first layer L1 may be determined. By identifying and perform regression analysis with regard to the position of the first align marks AGNM1 from a plurality of positions throughout the wafer W, a model function representing a difference between a designed position of a component on the first layer L1 and an identified position of the component may be determined.

According to some example embodiments, positions of align marks AGNM may be identified by pieces of light of different wavelengths. For example, when the positions of the align marks AGNM are identified by light of four different wavelengths, four model functions respectively corresponding to light of four different wavelengths may be provided, and the exposing process may be performed based on a combination model function generated based on a weighted sum (or a simple sum) of the four model functions.

As the semiconductor device is manufactured through a series of patterning processes performed on a plurality of material layers stacked in the vertical direction, the alignment of new patterns (e.g., patterns transferred to the photoresist film PR and patterns transferred to the second layer L2 resultingly) for previously formed circuit patterns (e.g., patterns formed at the first layer L1) may be an important element in enhancing the yield in manufacturing of the semiconductor device.

Here, two directions parallel with the upper surface of the wafer W and perpendicular with each other may be referred as an X direction and a Y direction, respectively. Furthermore, a direction substantially perpendicular to the upper surface of the wafer W may be referred to as Z direction. The X direction may be distinguished from the Y direction. More specifically, the Y direction may be a direction in which the scanning is performed during the exposure using the scanning method. The X direction may be a direction substantially perpendicular to the direction in which the scanning is performed, and the same applies to all drawings.

Although it is not explicitly described in the drawings, an additional layer including a circuit pattern, overlay marks, and an align mark may be arranged between the first layer L1 and the wafer W. In this case, an overlay function may be generated based on the first overlay marks OVM1 of the first layer L1 and the overlay marks of the additional layer, and the photoresist film PR may be exposed based on the model function and the overlay function.

According to some example embodiments, as described with reference to FIG. 5, the overlay between the first layer L1 and the underlying layer of the first layer L1 may be performed by absolute measurement. By the absolute measurement of the overlay, even when multiple layers are arranged under the first layer L1, an overlay function representing an absolute overlay quantity of the first layer L1 may be identified without historical calculation of respective relative functions of the multiple layers.

In the case of conventional overlay measurement, as an overlay function of a circuit layer formed immediately on the wafer is calculated based on an overlay value measured at an edge of the shot, a higher degree parameter may not be corrected. Moreover, when adding an accumulate sum of the relative overlay functions of the multiple underlying layers, due to accumulated errors included in each of the relative overlay functions of each layer, an absolute overlay calculated according to the accumulate sum may have an inaccurate value.

According to some example embodiments, through single-to-dual conversion (SDC) described in more detail below, the overlay function of the first layer L1 calculated by the absolute measurement of the overlay may be converted into an upper overlay function of the upper shot PU (see FIG. 4A) and a lower overlay function of the lower shot PL (see FIG. 4A). Accordingly, in the exposure of the photoresist film PR by using the model function generated from the first align marks AGNM1 of the first layer L1, correction of the overlay of each of the upper shot PU (see FIG. 4A) and the lower shot PL (see FIG. 4A) may be facilitated. As such, adjusting exposure of a target layer based on an overlay function of an underlying layer (e.g., the first layer L1) of the target layer (e.g., the photoresist film PR) may be referred to as a feed forward.

In this specification, the overlay function of the first layer L1 may be alternatively referred to as a first overlay function, and the upper overlay function of the upper shot PU (see FIG. 4A) and the lower overlay function of the lower shot PL (see FIG. 4A) calculated through the SDC of the overlay function of the first layer L1 may be alternatively referred to as a first upper overlay function and a first lower overlay function, respectively.

As described with reference to FIGS. 4A and 4B, an area of each of the upper shot PU and the lower shot PL transferred in operation P40 may be less than an area of the transferred full shot in operation P20. For example, as described with reference to FIGS. 4A and 4B, the area of the transferred full shot in operation P20 may be substantially identical to a sum of areas of the transferred upper shot PU and the transferred lower shot PL in operation P40. For example, as described with reference to FIGS. 4A and 4B, the area of the transferred full shot in operation P20 may be about twice as great as an area of each of the transferred upper shot PU and the transferred lower shot PL in operation P40.

In the exposing process, the EUV radiation beam may be used. According to some example embodiments, the wavelength of the EUV radiation beam may be within a range from about 4 nm to about 124 nm. According to some example embodiments, the wavelength of the EUV radiation beam may be within a range from about 5 nm to about 20 nm. According to some example embodiments, the wavelength of the EUV radiation beam may be within a range from about 13 nm to about 14 nm. According to some example embodiments, the wavelength of the EUV radiation beam may be about 13.5 nm.

A radiation system for generating the EUV radiation may include a laser configured to excite a plasma source and a source collector module configured to store the plasma source. The plasma source may include tin particles, Xe gas, or Li vapor. By irradiating a laser beam to the plasma source, plasma may be generated. The radiation system using the plasma source may be referred to as a laser-generated plasma source. A spark plasma source or a source based on synchrotron radiation may be provided by an electron storage ring.

An EUV photo mask including a circuit pattern transferred by the EUV radiation beam may include a silicon substrate and a plurality of silicon layers and molybdenum layers alternately stacked on the silicon substrate. A ruthenium (Ru)-containing layer may be further provided on the alternately stacked silicon-molybdenum layers. On the Ru-containing layer, a layout pattern including a tantalum boron nitride-containing layer and a lawrencium-containing layer may be formed. The various materials and layers concerning the EUV photo mask disclosed in the present specification are provided merely as an example, and the inventive concepts are not limited thereto.

According to some example embodiments, during when the wafer W is exposed, a wafer table supporting the wafer W may be driven so that a radiation beam is focused on a set position on the wafer W. The set position on the wafer W may be determined by the model function.

The EUV exposure may be performed by the scanning method. A slit limiting the EUV radiation beam to a partial area on a mask may be used in the EUV exposure. When light is controlled to pass through the slit and be irradiated to a partial area of the mask, a lithographic mask may be moved in a direction perpendicular to an extending direction of the slit, and the EUV radiation beam may be continuously irradiated to the lithographic mask. As such, an area on the wafer W to which light is irradiated through the scanning throughout the entire area of the mask may be a full shot as described above. The X direction shown in the drawing is an extending direction of the slit, and the Y direction is a scanning direction.

In operation P40, the EUV exposing process may include anamorphic reduction projection. A reduction ratio in the X direction in the EUV exposing process may be different from a reduction ratio in the Y direction. For example, a reduction ratio in the slit direction (e.g., the X direction) in the EUV exposure may be 1/4, and a reduction ratio in scanning direction (e.g., the Y direction) may be 1/8. That is, the length of a pattern transferred on the wafer W in the X direction may be about 1/4 of the length of a corresponding pattern on the EUV mask in the X direction, and the length of a pattern transferred on the wafer W in the Y direction may be about 1/8 of the length of a corresponding pattern on the EUV mask in the Y direction.

Accordingly, as a pattern formed on the EUV photo mask has a greater critical dimension than a pattern actually transferred to the wafer W, the pattern formed on the EUV photo mask may have an improved accuracy of a pattern, and the reliability of the lithography process using the EUV photo mask may also be improved.

According to some example embodiments, during the exposing process, a space above the wafer W may be filled with liquid having a high refractive index, such as water. Accordingly, at least a part of the wafer W may be covered with the liquid. The liquid may be referred to as an immersion solution, and when the wafer W is immersed, it may be construed as meaning that the wafer W is not only sunk in in liquid but also the immersion solution is placed on a path of the radiation beam for performing the exposure.

With reference to FIGS. 1, 4A, and 4B, in operation P40, by developing the photoresist film PR (see FIG. 3), the photoresist pattern PP may be formed.

The layout of the photoresist pattern PP illustrated in FIG. 4A may include an upper shot PU and a lower shot PL. According to some example embodiments, the upper shot PU and the lower shot PL may be substantially the same. The upper shot PU and the lower shot PL may be formed by exposing the same lithographic mask for EUV.

The upper shot PU and the lower shot PL may horizontally divide the photoresist pattern PP. The length of each of the upper shot PU and the lower shot PL in the X direction may be substantially identical to the length of the full shot of the first layer L1 in the X direction. The length of each of the upper shot PU and the lower shot PL in the Y direction may be less than the length of the full shot of the first layer L1 in the Y direction. The length of each of the upper shot PU and the lower shot PL in the X direction may be greater than the length of each of the upper shot PU and the lower shot PL in the Y direction. The length of each of the upper shot PU and the lower shot PL in the X direction may be about 26 mm, and the length of each of the upper shot PU and the lower shot PL in the Y direction may be about 16.5 mm.

In operation P50, an after-development inspection (ADI) based on absolute measurement may be performed.

The ADI is a process to inspect and measure various characteristics of the photoresist pattern PP on the wafer W. According to some example embodiments, the characteristics of the inspected or measured photoresist pattern PP may include the size, shape, and profile of features formed at the photoresist pattern PP, an overlay of a preceding layer (e.g., the first layer L1) and photoresist pattern PP, defect which may be found in the photoresist pattern PP, etc.

According to some example embodiments, the ADI may include obtaining overlay values for each position of the overlay marks OVM1 and the overlay molds OVM by measuring the first overlay marks OVM1 of the entire upper shot PU and the lower shot PL and the overlay molds OVM formed on the photoresist pattern. According to some example embodiments, the ADI may include calculating an overlay function representing the amount of overlay of any element (e.g., a feature formed in the photoresist pattern PP) over the upper shot PU and lower shot PL by regressing the measured overlay value.

According to some example embodiments, an overlay may be measured by any one of an image-based optical system and a scattering optical system. According to some example embodiments, the ADI may be performed by absolute overlay measurement. Hereinafter, aspects of the absolute overlay measurement are described with reference to FIG. 5.

FIG. 5 illustrates a field of view FOV of an inspection device measuring an overlay between one of the first overlay marks OVM1 and one of overlay molds OVM corresponding thereto.

Each of the first overlay marks OVM1 may be a main scale, and each of the overlay molds OVM may be a vernier scale. Each of the first overlay marks OVM1 may be an external box, and each of the overlay molds OVM may be an internal box having a smaller size than each of the first overlay marks OVM1.

According to some example embodiments, by determining a displacement vector between a center OVM1C of each of the first overlay marks OVM1 and a reference position RP of the field of view FOV, an absolute overlay of the first overlay marks OVM1 may be measured, and by determining a displacement vector between a center OVMC of each of the overlay molds OVM and the reference position RP of the field of view FOV, an absolute overlay of the overlay molds OVM may be measured.

For example, when the coordinate of the reference position RP is defined as (0, 0), the center OVM1C of the first overlay marks OVM1 may be (x1, y1), which is an absolute overlay vector of the first overlay marks OVM1. Similarly, when the coordinate of the reference position RP is (0, 0), the center OVMC of the overlay molds OVM may be (x2, y2), which is an absolute overlay vector of the overlay molds OVM. According to some example embodiments, an inspection device needs to provide an accurate reference point of the field of view FOV for absolute measurement of overlay. Thus, using a wafer stage having a good accuracy may be desired to determine a position of the wafer W accurately.

According to some example embodiments, from the absolute measurement of the first overlay marks OVM1 and the overlay molds OVM, a relative overlay between the first overlay marks OVM1 and the overlay molds OVM may be determined to be (x2−x1, y2−y1).

With reference to FIGS. 1, 4A, and 4B, after the ADI, when the overlay is beyond a critical range (NG), the photoresist pattern PP may be removed through a strip process using chemicals, etc., and then the photoresist film PR (see FIG. 3) may be provided again in operation P20. In operation P30, the aligning process and the exposing process may be performed to compensate for the overlay function generated in operation P50.

In the present specification, for convenience of explanation, the photoresist pattern PP removed in operation P55 and the corresponding photoresist film PR (see FIG. 3) may be alternatively referred to as a first photoresist pattern and a photoresist pattern film, respectively, and after the photoresist pattern PP is removed in operation P55, the photoresist film PR (see FIG. 3) provided again in the rework process may be alternatively referred to as a second photoresist film.

Here, while the upper shot PU and the lower shot PL are transferred by separate exposing processes, the overlay function may be calculated for both of the upper shot PU and the lower shot PL. Accordingly, the SDC through which an overlay function calculated with respect to a single shot is converted into overlay functions for two different shots (e.g., the upper shot PU and the lower shot PL) may be performed to compensate for the overlay function calculated in operation P50.

According to some example embodiments, the SDC may be performed according to the following conversion equations.

$$SSO = USO + LSO$$

$$SSO = \sum_{n=1}^{20} RKn\left(x^h y^i\right)(j\hat{x} + k\hat{y})$$

$$USO = A_x \sum_{n=1}^{20} RKn\left(x^h y^i\right)(j\hat{x} + k\hat{y}),\ LSO = B_y \sum_{n=1}^{20} RKn\left(x^h y^i\right)(j\hat{x} + k\hat{y})$$

$$n = h + i + j + k,$$

$$j + k = 1 \text{ or } 2,\ j = 0 \text{ or } 1,\ k = 0 \text{ or } 2,$$

$$0 \le h + i \le 3h = 0, 1, 2 \text{ or } 3,\ i = 0, 1, 2 \text{ or } 3$$

Here, $$\sum_{n=1}^{20} RKn\left(x^h y^i\right)(j\hat{x} + k\hat{y})$$

is an overlay function calculated by regression analysis of both of the upper shot PU and the lower shot PL, $$A_x \sum_{n=1}^{20} RKn\left(x^h y^i\right)(j\hat{x} + k\hat{y})$$

is an overlay function of the upper shot PU, representing the overlay of the upper shot PU, and $$B_y \sum_{n=1}^{20} RKn\left(x^h y^i\right)(j\hat{x} + k\hat{y})$$

is an overlay function of the lower shot PL, representing the overlay of the lower shot PL.

Ax is a weighting function depending on h, i, j, and k, and By is a weighting function depending on h, i, j, and k. $\hat{x}$ is a unit vector in the X direction, and $\hat{y}$ is a unit vector in the Y direction. In some cases, an exposing device may not correct the $y^3$ component in the X direction, in such case, an overlay function simultaneously determining both of the upper shot PU and the lower shot PL through regression analysis under a constraint that RK20 is 0 may be calculated.

According to some example embodiments, the overlay function may be regression-analyzed based on a polynomial function. For example, RK1 is a parallel transition parameter in the X direction (i.e., a constant·$\hat{x}$ component), RK2 is a parallel transition parameter in the Y direction (i.e., a constant·$\hat{y}$ component), RK3 is an isotropic expansion parameter in the X direction (i.e., a coefficient of $x\hat{x}$) RK4 is an isotropic expansion parameter in the Y direction (i.e., a coefficient of $y\hat{y}$), RK5 is a rotation parameter in the X direction (i.e., a coefficient of $y\hat{x}$), and RK6 is a rotation parameter in the Y direction (i.e., a coefficient of $x\hat{y}$).

RK7 to RK12 may be second-order non-linear components. RK7 is a parameter which is a coefficient of $x^2\hat{x}$, RK8 is a parameter which is a coefficient of $y^2\hat{y}$, RK9 is a parameter which is a coefficient of $x \cdot y\hat{x}$, RK10 is a parameter which is a coefficient of $y \cdot x\hat{y}$, RK11 is a parameter which is a coefficient of $y^2\hat{x}$, and RK12 is a parameter which is a coefficient of $x^2\hat{y}$.

RK13 to RK20 may be third-order non-linear components. RK13 is a parameter which is a coefficient of $x^3\hat{x}$, RK14 is a parameter which is a coefficient of $y^3\hat{y}$, RK15 is a parameter which is a coefficient of $x^2 \cdot y\hat{x}$, RK16 is a parameter which is a coefficient of $y^2 \cdot x\hat{y}$, RK17 is a parameter which is a coefficient of $x \cdot y^2\hat{x}$, RK18 is a parameter which is a coefficient of $y \cdot x^2\hat{y}$, RK19 is a parameter which is a coefficient of $x^3\hat{y}$, and RK20 is a parameter which is a coefficient of $y^3\hat{x}$.

In an upper shot PU area, a value of the overlay function of a single shot SSO representing all of the upper shot PU and the lower shot PL may be identical or substantially similar to a value of the upper overlay function USO representing only the upper shot PU. Similarly, in a lower shot PL area, a value of the overlay function of a single shot SSO representing all of the lower shot PL and the upper shot PU may be identical or substantially similar to a value of the lower overlay function LSO representing only the lower shot PL.

At this time, the overlay function of a single shot SSO may be based on a coordinate system in which the upper shot PU and the lower shot PL are considered as a single shot, the upper overlay function USO may be based on a coordinate system limited to be within the upper shot PU, and the lower overlay function LSO may be based on a coordinate system limited to be within the upper shot PU.

According to some example embodiments, an advanced process controller or an advanced process controlling system may be configured to calculate an overlay function of the upper shot PU and an overlay function of the lower shot PL through regression analysis of the upper shot PU and the lower shot PL as a single shot, and conversion of the overlay function of a single shot. According to some example embodiments, the advanced process controller or the advanced process controlling system may be configured to generate a feed signal for exposing the photoresist film PR (see FIG. 3) based on the overlay function of the upper shot PU and the overlay function of the lower shot PL in operation P40.

In this specification, the overlay function of the photoresist pattern PP may be alternatively referred to as a second overly function, and the upper overlay function of the upper shot PU (see FIG. 4A) and the lower overlay function of the lower shot PL (see FIG. 4A) calculated through the SDC of the overlay function of the photoresist pattern PP may be alternatively referred to as a second upper overlay function and a second lower overlay function, respectively.

As described above, to correct the exposing process during the rework after the ADI according to some example embodiments, the overlay function USO of the upper shot PU and the overlay function LSO of the lower shot PL may be calculated based on the single overlay function SSO calculated by simultaneously measuring the upper shot PU and the lower shot PL.

Accordingly, compared to when the upper shot PU and the lower shot PL are separately measured, a time desired for measurement may be reduced, and a turnaround time of a semiconductor device may also be reduced, which leads to improved productivity in manufacturing of semiconductor devices.

Moreover, when an overlay function is calculated based on measurement of only one of the upper shot PU and the lower shot PL, the number of measurement positions of overlay for regression analysis may be insufficient, and the resulting overlay function may be inaccurate due to over-fitting. According to some example embodiments, as the overlay function is calculated from the first overlay marks OVM1 and the overlay molds OVM of the upper shot PU and the lower shot PL based on measurement values of the overlays, a sufficient number of overlay measurements may be provided, and the reliability of the overlay function may be improved. The improved reliability of the overlay function may lead to increased yield in manufacturing semiconductor devices.

Moreover, even in case of anamorphic reduction projection with a reduction ratio of 1/8 in the Y direction in a high numerical aperture environment, as the overlay of the upper shot PU and the lower shot PL are simultaneously measured, the existing advanced processor controller or advanced controlling system may be used, and additional capital expenditures (CAPEX) may be not be desired.

As such, some non-limiting example embodiments regarding the overlay regression analysis based on polynomial functions are described. Based on the foregoing descriptions, a person skilled in the art may easily conceive regression analysis of an overlay using a complete basis set of a functional space, such as a discontinuous Chebyshev polynomial, a Zernike polynomial, etc. and the SDC of the regression-analyzed overlay function. In such case, each of bases constituting the complete basis set may be a finite or infinite discrete orthogonal polynomial.

With reference to FIGS. 1, 6A, and 6B, when the overlay is determined to be within a critical range in operation P50, a circuit pattern, second align marks AGNM2, and the second overlay marks OVM2 may be formed at the second layer L2 in operation P60 by using processes, such as etching, deposition, planarization, etc.

Figure 7:
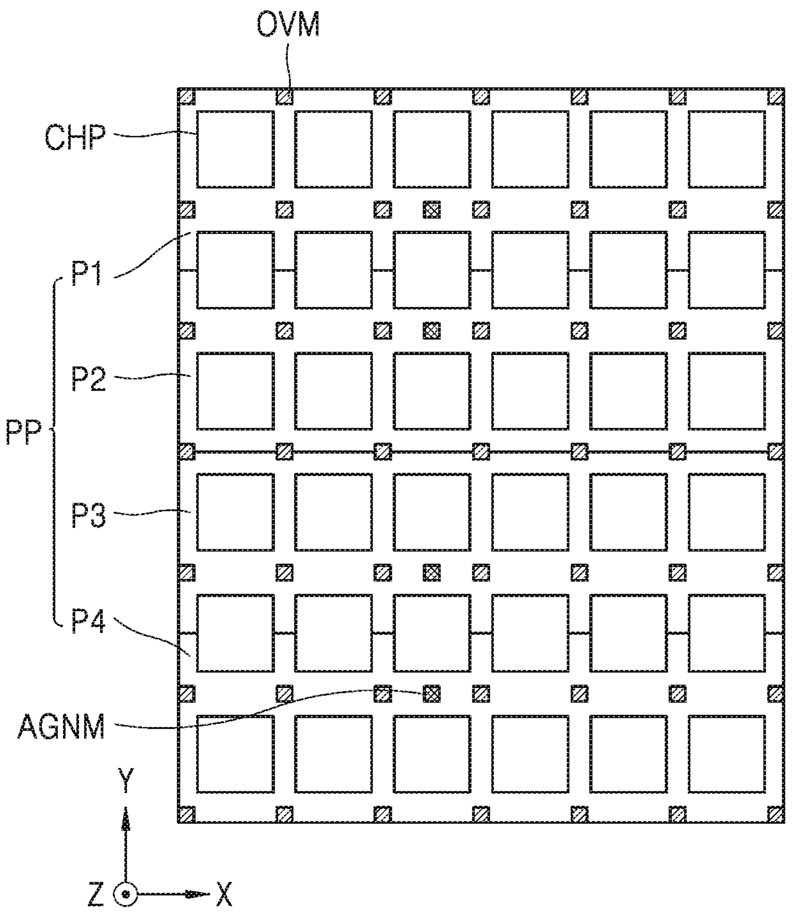
FIG. 7 is a diagram for explaining a method of manufacturing a semiconductor device, according to another example embodiment.

FIG. 7 is a diagram for explaining a method of manufacturing a semiconductor device, according to another example embodiment. More specifically, FIG. 7 shows a part corresponding to FIG. 4A.

Hereinafter, any redundant explanation described with reference to FIGS. 1 to 6B is omitted, and the example embodiments are described focusing on differences for convenience in explanation.

With reference to FIG. 7, the photoresist pattern PP may include a first shot P1, a second shot P2, a third shot P3, and a fourth shot P4. The first to fourth shots P1, P2, P3, and P4 may be identical or become identical to each other by reversal. For example, the first shot P1 may be identical to the fourth shot P4, and the second shot P2 may be identical to the third shot P3. The first shot P1 and the second shot P2 may be symmetrical to each other with respect to an axis parallel with the X direction. Accordingly, the first shot P1 reversed with respect to the axis parallel with the X direction may be identical to the second shot P2. Similarly, the third shot P3 reversed with respect to the axis parallel with the X direction may be identical to the fourth shot P4. As a non-limiting example, the first to fourth shots P1, P2, P3, and P4 may be identical or substantially identical to each other.

According to some example embodiments, in the ADI, the overlay molds OVM formed at the first to fourth shots P1, P2, P3, and P4 may be measured simultaneously. Accordingly, an overlay function defining an overlay of an element in the first to fourth shots P1, P2, P3, and P4 may be calculated.

According to some example embodiments, as described with reference to FIGS. 1 to 6B, when an overlay value is beyond a critical range, the photoresist pattern PP may be removed, and the rework process may be conducted.

According to some example embodiments, the rework process may include generating an overlay function of the first shot P1, an overlay function of the second shot P2, an overlay function of the third shot P3, and an overlay function of the fourth shot P4 through single to quadruple conversion (SQC) of the overlay function.

According to some example embodiments, the SQC may be performed according to the following conversion equations.

$$SSO = SO1 + SO2 + SO3 + SO4$$

$$SSO = \sum_{n=1}^{20} RKn(x^h y^i)(j\hat{x} + k\hat{y})$$

$$SO1 = A_w \sum_{n=1}^{20} RKn(x^h y^i)(j\hat{x} + k\hat{y}),$$

$$SO2 = B_x \sum_{n=1}^{20} RKn(x^h y^i)(j\hat{x} + k\hat{y}),$$

$$SO3 = C_y \sum_{n=1}^{20} RKn(x^h y^i)(j\hat{x} + k\hat{y}),$$

$$SO4 = D_z \sum_{n=1}^{20} RKn(x^h y^i)(j\hat{x} + k\hat{y})$$

$$n = h + i + j + k,$$

$$j + k = 1 \text{ or } 2,\ j = 0 \text{ or } 1,\ k = 0 \text{ or } 2,$$

$$0 \le h + i \le 3h = 0, 1, 2 \text{ or } 3,\ i = 0, 1, 2 \text{ or } 3$$

Here, $$\sum_{n=1}^{20} RKn(x^h y^i)(j\hat{x} + k\hat{y})$$

is an overlay function calculated by regression analysis of all of the first to fourth shots P1, P2, P3, and P4, $$A_x \sum_{n=1}^{20} RKn(x^h y^i)(j\hat{x} + k\hat{y})$$

an overlay function of the first shot P1, representing only an overlay of the first shot P1, $$B_y \sum_{n=1}^{20} RKn(x^h y^i)(j\hat{x} + k\hat{y})$$

is an overlay function of the second shot P2, representing only an overlay of the second shot P2, $$C_x\sum_{n=1}^{20} RKn(x^h y^i)(j\hat{x}+k\hat{y})$$

is an overlay function of the third shot P3, representing only an overlay of the third shot P3, and $$D_y\sum_{n=1}^{20} RKn(x^h y^i)(j\hat{x}+k\hat{y})$$

is an overlay function of the fourth shot P4, representing only an overlay of the fourth shot P4.

Aw is a weighting function depending on h, i, j, and k, Bx is a weighting function depending on h, i, j, and k, Cy is a weighting function depending on h, i, j, and k, and Dz is a weighting function depending on h, i, j, and k. In some cases, an exposing device may not correct the $y^3$ component in the X direction, and in such case, an overlay function of a single shot through regression analysis under a constraint that RK20 is 0 may be calculated.

In the example embodiment of FIG. 7, the reduction ratio of the EUV exposure in the X direction may be 1/4, the reduction ratio in the Y direction may be 1/16, and accordingly, except for the conversion of one overlay function into overlay functions of four shots, the embodiment of FIG. 7 is the same as or substantially similar to the description provided above with reference to FIGS. 1 to 6B.

Furthermore, based on the description, a person skilled in the art may easily conceive an example embodiment in which a reduction ratio of the EUV exposure in the Y direction is 1/32, and a single overlay function is converted into overlay functions of eight shots, and an embodiment in which a reduction ratio of the EUV exposure in the Y direction is 1/(4·n), and a single overlay function is converted into overlay functions of n (n is an integer greater than or equal to 3) shots.

Figure 8:
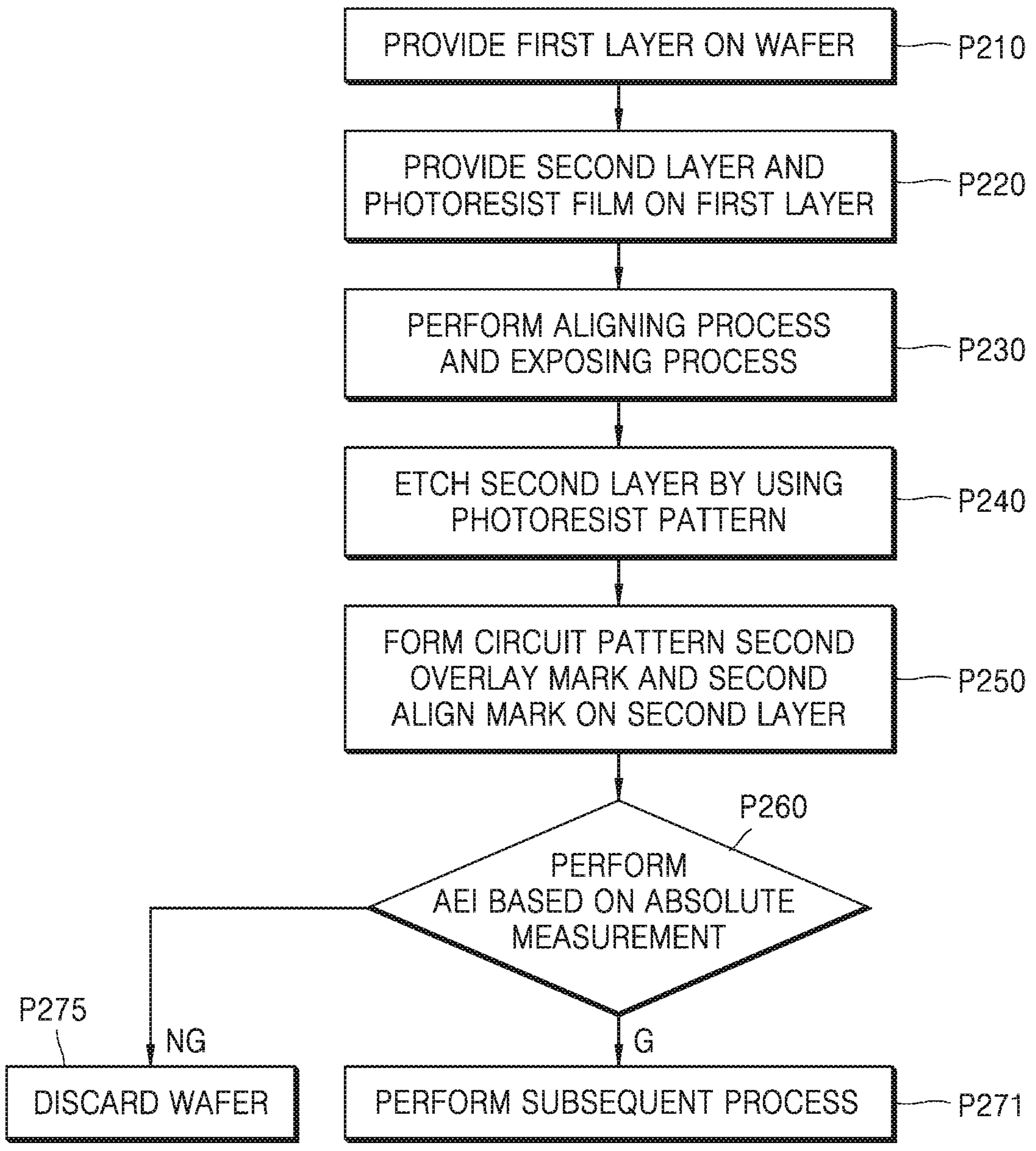
FIG. 8 is a flowchart for explaining a method of manufacturing a semiconductor device, according to still another example embodiment.

FIG. 8 is a flowchart for explaining a method of manufacturing a semiconductor device, according to still another example embodiment.

Hereinafter, any redundant description provided above with reference to FIGS. 1 to 6B is omitted, and the embodiments are described focusing on differences for convenience in explanation.

With reference to FIG. 8, operations P210 to P240 may be identical or substantially identical to respective operations P10 to P40 described with reference to FIG. 1.

With reference to FIGS. 8 and 4B, in operation P250, the second layer L2 may be etched by using the photoresist pattern PP. Accordingly, a pattern of an EUV lithographic mask to which the photoresist pattern PP is transferred may be transferred to the second layer L2.

With reference to FIGS. 8 and 6B, in operation P260, an after etch inspection (AEI) based on absolute measurement may be performed. Here, the absolute measurement may refer to the method of measuring an overlay, described above with reference to FIG. 5. The AEI of operation P260 may be identical or substantially identical to the wafer inspection of operation P50 except for the difference of using the second overlay marks OVM2 (see FIG. 6B) transferred to the second layer L2.

In operation P260, when the overlay is within a threshold (G), a subsequent process may be performed in operation P271. In operation P260, when the overlay is beyond the threshold (NG), the etching has already been performed, and the wafer W may be discarded in operation P275. Accordingly, undesired expenses which may have been incurred due to additional process on a faulty wafer W may be reduced.

Figure 9:
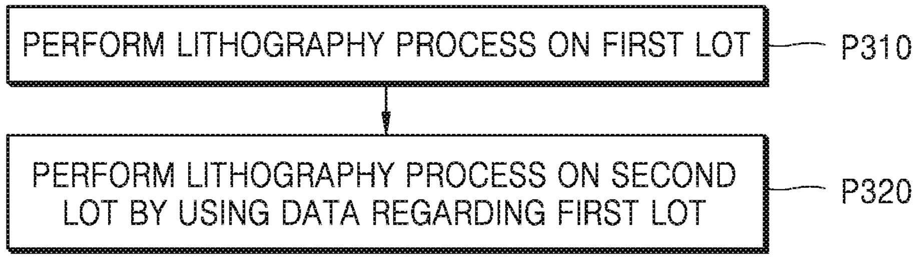
FIG. 9 is a flowchart for explaining a method of manufacturing a semiconductor device, according to yet another example embodiment.

FIG. 9 is a flowchart for explaining a method of manufacturing a semiconductor device, according to yet another example embodiment.

With reference to FIG. 9, through a method similar to the methods described with reference to FIGS. 1, 8, and 9, the lithography process may be performed on a group of multiple wafers in, for example, a first lot, in operation P310.

Then, in operation P320, the lithography process may be performed on a second lot based on the overlay function of the upper shot PU (see FIG. 4A) and the overlay function of the lower shot PL (see FIG. 4A) generated by performing the SDC on the overlay function of a single shot for the first lot.

According to some example embodiments, the lithography process on the second lot may be performed based on the model function generated from alignment marks, the overlay function of the upper shot PU (see FIG. 4A) and the overlay function of the lower shot PL (see FIG. 4A). According to some example embodiments, the model function generated from the align marks may be amended to compensate for the overlay function of the upper shot PU (see FIG. 4A) and the overlay function of the lower shot PL (see FIG. 4A) in the lithography process of operation P320. According to some example embodiments, the amendment in the lithography process may include adjustment of intensity of light, scanning speed, scanning direction, offset, rotation, size, etc.

The method of manufacturing a semiconductor device illustrated in FIG. 9 may be referred to as a lot-to-lot feedback process. The lot-to-lot feedback may be based on at least one of the ADI of FIG. 1 and the AEI of FIG. 8.

Figure 10:
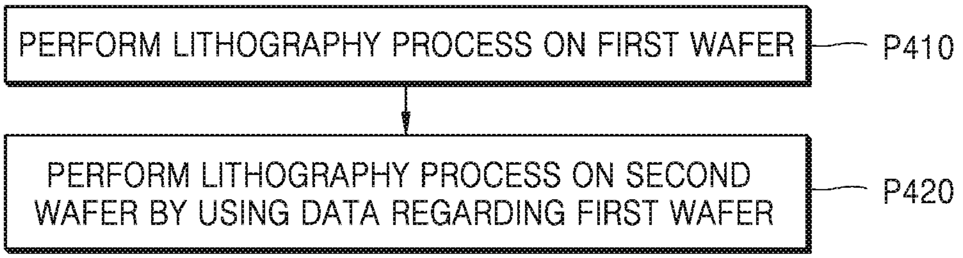
FIG. 10 is a flowchart for explaining a method of manufacturing a semiconductor device, according to yet another example embodiment.

FIG. 10 is a flowchart for explaining a method of manufacturing a semiconductor device, according to yet another example embodiment.

With reference to FIG. 10, in operation 410, the lithography process may be performed on a first wafer. The lithography process of operation P410 may be identical or substantially identical to the lithography process described above with reference to FIG. 1. Accordingly, an overlay function of a single shot of the photoresist pattern PP may be calculated.

Then, the lithography process may be performed on a second wafer by performing the SDC on the overlay function of the single shot measured with respect to the first wafer. According to some example embodiments, the lithography process performed on the second wafer may be a lithography process amended by an overlay function of the upper shot PU (see FIG. 4A) and an overlay function of the lower shot PL (see FIG. 4A) generated by performing the SDC on the overlay function of the single shot of the first wafer. According to some example embodiments, the lithography process of operation P420 may be amended to compensate for the overlay function of the upper shot PU (see FIG. 4A) and the overlay function of the lower shot PL (see FIG. 4A).

The method of manufacturing a semiconductor device described with reference to FIG. 10 may be referred to as a wafer-to-wafer feedback process. The wafer-to-wafer feedback may be based on at least one of the ADI of FIG. 1 and the AEI of FIG. 8.

While the inventive concepts have been particularly shown and described with reference to some example embodiments thereof, it will be understood that various changes in form and details may be made therein without departing from the spirit and scope of the following claims.

What is claimed is:

1. A method of manufacturing a semiconductor device, the method comprising:

forming a first layer on a wafer through a single shot exposure, a single shot of the first layer including first overlay marks;

forming a second layer and a first photoresist film on the first layer; and performing an upper shot exposure and a lower shot exposure onto the first photoresist film based on a first overlay function of the single shot of the first layer generated based on absolute measurement of the first overlay marks, wherein an upper shot transferred by the upper shot exposure and a lower shot transferred by the lower shot exposure are identical to each other, and an area of each of the upper shot and the lower shot is less than an area of the single shot of the first layer.

2. The method of claim 1, wherein the single shot exposure is performed by using at least one of a deep ultraviolet (DUV) radiation beam and an extreme ultraviolet (EUV) radiation beam with a numerical aperture less than about 0.35, and the upper shot exposure and the lower shot exposure are performed by using an EUV radiation beam with a numerical aperture equal to or greater than 0.35.

3. The method of claim 1, wherein the upper shot exposure and the lower shot exposure have a reduction ratio of 1/4 in a first direction parallel with an upper surface of the wafer and a reduction ratio of 1/N in a second direction perpendicular to the first direction, where N is an integer greater than 4.

4. The method of claim 1, further comprising:

calculating a first upper overlay function and a first lower overlay function based on the first overlay function, the first upper overlay function representing an overlay of a part corresponding to the upper shot, the first lower overlay function representing an overlay of a part corresponding to the lower shot.

5. The method of claim 4, wherein, in the upper shot, a value of the first overlay function is equal to a value of the first upper overlay function, and in the lower shot, the value of the first overlay function is equal to a value of the first lower overlay function.

6. The method of claim 4, wherein the first overlay function is based on a coordinate system in which the upper shot and the lower shot are considered as a single shot, the first upper overlay function is based on a coordinate system limited to be within the upper shot, and the first lower overlay function is based on a coordinate system limited to be within the lower shot.

7. The method of claim 1, further comprising:

forming a first photoresist pattern by developing the first photoresist film;

calculating a second overlay function representing an overlay of the upper shot and the lower shot by absolute measurement of the first photoresist pattern and the first overlay marks;

removing the first photoresist pattern in response to the second overlay function being out of a range;

forming a second photoresist film on the second layer; and calculating a second upper overlay function and a second lower overlay function based on the second overlay function, the second upper overlay function representing an overlay of the upper shot of the first photoresist film, the second lower overlay function representing an overlay of the lower shot of the first photoresist film.

8. The method of claim 7, further comprising:

exposing the second photoresist film to the upper shot based on the second upper overlay function; and exposing the second photoresist film to the lower shot based on second lower overlay function.

* * * * *